April 7, 1970 HISASHI EGUCHI ET AL 3,505,611

AMPLIFIER CIRCUIT

Filed July 18, 1968

United States Patent Office
3,505,611
Patented Apr. 7, 1970

3,505,611
AMPLIFIER CIRCUIT

Hisashi Eguchi and Hideo Matsuoka, Tokyo, Japan, assignors to Iwatsu Electric Co., Ltd., Tokyo, Japan
Filed July 18, 1968, Ser. No. 745,777
Claims priority, application Japan, July 21, 1967, 42/46,619
Int. Cl. H03f 3/68
U.S. Cl. 330—30 3 Claims

ABSTRACT OF THE DISCLOSURE

Amplifier circuit of the invention comprises a pair of transistors having different polarities. A diode is inserted into a connection between collectors of the transistors. One of the transistors is a PNP transistor having a function of A class amplifier, and the other one is a NPN transistor having a function of switching operation. The NPN transistor is impressed by a pulse signal at a time of trailing of the output of the PNP transistor, thereby the trailing wave form of the output of the PNP transistor is improved in rapid trailing.

Figure 1:
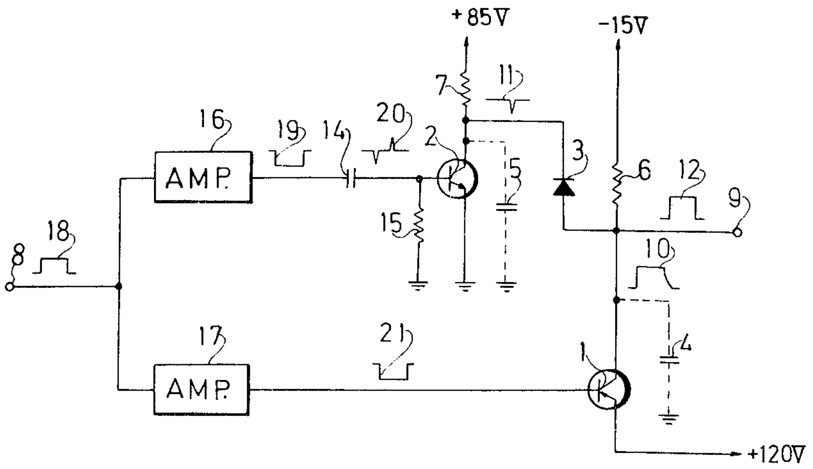

The present invention relates to an amplifier circuit having large amplitude output and using NPN and PNP transistors for obtaining output wave signal having fast response.

Generally, in case of using PNP transistor in the amplifier circuit for obtaining large amplitude output signal, the characteristic feature of falling of the output signal is inferior in comparison with that of the rising of the output signal, on the contrary in case of using NPN transistor in the amplifier circuit, the characteristic feature of rising of the output signal is vice versa. To improve the above-mentioned drawbacks, a combined utilization of NPN and PNP transistors in the amplifier circuit was tried. In the above-mentioned combined utilization, the both collectors of the NPN and PNP transistor are directly connected. However, it is very difficult to obtain the output signal having better frequency characteristic because of adding the excess collector capacity of the transistors to the loading capacity of the transistors respectively.

The principal object of the present invention is to provide an improved amplifier circuit eliminating the above-mentioned drawbacks.

Other objects and features of the invention will more fully appear from the following description and the accompanying drawings and will be particularly pointed out in the claims.

FIG. 1 is a diagram illustrating an amplifier circuit embodying the present invention, FIGS. 2A, 2B and 2C are wave form of the input signal, input signal of a NPN transistor and input signal of a PNP transistor of the amplifier circuit shown in FIG. 1, respectively, FIG. 3 is a diagram illustrating the wave forms of the collector of the NPN transistor and PNP transistor of the amplifier circuit shown in FIG. 1.

Generally, the amplifier circuit of the present invention comprises PNP and NPN transistors, a diode inserted into a connection between collectors of the above-mentioned two transistors. By the above-mentioned insertion of the diode, the falling character of the PNP transistor which is used as the A class amplifier can be compensated by a pulse signal impressed to the NPN transistor.

The detailed construction and function of the amplifier circuit of the invention is hereinafter illustrated with reference of the drawings. In an embodiment of the amplifier circuit of the invention shown in FIG. 1, a PNP transistor 1 forms A class amplifier. A compensation circuit which compensate a frequency character of an amplifier of the PNP transistor 1 comprises a NPN transistor 2 and a diode 3 which is inserted to a connection between a collector of the PNP transistor 1 and a collector of the NPN transistor 2. A collector capacity 4 of the PNP transistor 1, a collector capacity 5 of the NPN transistor 2, a resistance 6 of the PNP transistor 1, a resistance 7 of the NPN transistor 2 are arranged in the circuit as shown in FIG. 1.

When an input pulse as shown in FIG. 2A is impressed to an input terminal 8, an output pulse signal corresponding to the input pulse, for example an output pulse signal having 80 volts of peak to peak, can be obtained at an output terminal 9 of the amplifier circuit shown in FIG. 1. When a base of the NPN transistor 2 is not impressed by any input signal, the transistor 2 is maintained at a cut-off condition or a condition being similar to the cut-off condition. At the above-mentioned cut-off condition of the transistor 2, the diode 3 is maintained at an off condition, consequently the transistor 1 does not affect by the collector capacity 5 of the NPN transistor 2. On the other hand, as the PNP transistor 1 operates with large amplitude, the falling character of the transistor 1 becomes inferior one. However, when a positive pulse such as shown in FIG. 2B is impressed to the NPN transistor 2 at the time of the above-mentioned falling of the output of the PNP transistor 1, the collector potential of the NPN transistor 2 is fallen, and the condition of the diode 3 is changed to "ON" consequently the collector potential of the NPN transistor 2 is rapidly fallen, thereby the falling character of the output wave signal of the PNP transistor 1 can be improved. However, in the above-mentioned improvement, as a certain period defined by a time constant $T=$(collector capacity of the transistor 2)×(resistance of the NPN transistor 2) is inevitable to recover the condition of the NPN transistor 2, there is certain restriction of the repetition rate of the amplified signal. Therefore, the above-mentioned amplifier circuit of the invention is effectively applied for the amplifier such as the unblanking amplifier of the oscilloscope wherein the input wave signal and the upper limit of the repetition rate are defined. Referring to FIGS. 1 and 2, when the NPN transistor 2 is not impressed by any input signal the output wave signal at the output terminal 9 is shown by a wave signal 10 in FIG. 3. As the output wave signal of the NPN transistor 2 is shown by a wave signal 11 in FIG. 3, the output wave signal at the output terminal 9 of the amplifier circuit having NPN and PNP transistors is improved as shown in a wave signal 12 in FIG. 3, where the working time of the diode 3 is represented by 13. As it is clearly shown in FIG. 3, the falling character of the output wave signal of the PNP transistor 1 is improved by operation of the NPN transistor 2, thereby the improved output wave signal 12 can be satisfactorily obtained.

In the above-mentioned embodiment, the PNP transistor 1 is used as a transistor having a function of A class amplifier and the NPN transistor 2 is used as a transistor having a function of switching operation, however a NPN transistor and a PNP transistor can be used on behalf of the above-mentioned PNP transistor 1 and NPN transistor 2 respectively to obtain the same operative function of the amplifier circuit shown in FIG. 1.

In the above-mentioned improved amplifier circuit, the influence of the collector capacity of the NPN transistor 2 affecting to the function of the PNP transistor 1 does not exceed over the magnitude of the reverse capacity of the diode 3. Consequently, by applying the improved amplifier circuit of the present invention, the frequency character of the amplifier circuit can be improved very much, further when a diode having smaller magnitude of the reverse capacity is used, the transistor having comparatively larger magnitude of the raverse capacity can be used. While, the transistor having small magnitude of the reverse capacity is preferably used as the transistor having a function of the high voltage transistor for switching of the conventional amplifier circuit, however the abovementioned-transistor is expensive.

While the invention has been described in conjunction with certain embodiments thereof, it is to be understood that various modifications and changes may be made without departing from the spirit and scope of the invention.

What is claimed is:

1. Amplifier circuit comprising, two parallel transistors of opposite polarity, one of said transistors comprising a class A transistor amplifier, a diode connected between the collectors of said transistors, output connections from said diode and said class A transistor amplifier, means for driving the class A transistor amplifier, means to impress on the other of said transistors a switching pulse to unblock it and superpose a negative output pulse on the output of said class A transistor amplifier to improve the trailing end of the output of said class A transistor amplifier and cause the class A transistor amplifier to have a square wave output of larger amplitude corresponding to a lesser amplitude input square wave to said class A transistor amplifier.

2. Amplifier circuit according to claim 1, in which said class A transistor amplifier comprises an PNP transistor and in which said other transistor comprises a NPN transistor.

3. Amplifier circuit according to claim 1, in which said class A transistor amplifier comprises an NPN transistor and the other transistor comprises a PNP transistor.

References Cited

UNITED STATES PATENTS 3,333,113 7/1967 Cole et al. ________ 307—241 X

JOHN KOMINSKI, Primary Examiner

L. J. DAHL, Assistant Examiner

U.S. Cl. X.R.

330—17

UNITED STATES PATENT OFFICE
CERTIFICATE OF CORRECTION

Patent No. 3,505,611 Dated April 7, 1970

Inventor(s) Hisashi Eguchi and Hideo Matsuoka

It is certified that error appears in the above-identified patent and that said Letters Patent are hereby corrected as shown below:

Col. 1, line 13, delete "Amplifier" and insert --An amplifier--;
line 13, delete "of the invention comprises" and insert --having--;
line 14, delete "having" and insert --with--;
line 14, delete "insert-" and insert --connected--;
line 15, delete "ed into a connection";
line 17, delete "A" and insert --a--;
line 17, after "class" insert --A--;
line 17, after "NPN" insert --switching--;
line 18, delete "having a function of switching operation";
line 19, delete "impressed" and insert --biased--;
line 20, delete "trailing" and insert --decrease--;
line 20, delete "thereby" and insert --whereby--;
line 21, delete "trailing wave form" and insert --decreasing waveform--;
line 22, delete "rapid trailing" and insert --fall time--;
line 27, after "having" insert --a--;
line 29, delete "of using" and insert --a--;
line 30, after "circuit" insert --is used--;
line 30, after "obtaining" insert --a--;
line 31, after "of" first occurrence insert --the--;
line 33, delete "of using" and insert --an--;
line 34, after "transistor" insert --is used--;
line 35, after "of" first occurrence insert --the--;
line 41, delete "the" and insert --an--;
line 41, after "having" insert --a--;
line 42, after "of" insert --the--;
line 42, after "adding" insert --of--;
line 42, delete "capacity" and insert --capacitance--;
line 43, delete "capacity" and insert --capacitance--;

UNITED STATES PATENT OFFICE

CERTIFICATE OF CORRECTION

Patent No. 3,505,611 Dated April 7, 1970

Inventor(s) Hisashi Eguchi and Hideo Matsuoka

It is certified that error appears in the above-identified patent and that said Letters Patent are hereby corrected as shown below:

Col. 1, line 54, delete "wave form of" and insert --waveforms corresponding to--;
line 55, after "signal," insert --an--;
line 55, after "and" insert --an--;
line 58, delete "wave forms" and insert --waveforms--;
line 62, after "transistors," insert --and--;
line 62, delete "in-";
line 63, delete "serted into" and insert --in--;
line 64, delete "By the above-mentioned in-" and insert --Because--;
line 65, delete "insertion--;
line 66, delete "the A" and insert --a--;
line 66, after "class" insert --A transistor--;
line 67, delete "impressed" and insert --applied--;
line 70, delete "illustrated" and insert --described--;
line 71, delete "of" first occurrence and insert --to--.

Col. 2, line 2, delete "A" and insert --a--;
line 2, after "class" insert --A--;
line 3, delete "compensate a" and insert --compensates the--;
line 3, delete "an" and insert --the--;
line 4, delete "of the" and insert --or--;
line 5, delete "inserted to" and insert --in--;
line 7, delete "capacity" and insert --capacitance--;
line 8, delete "capacity" and insert --capacitance--;
line 9, delete "resistance" and insert --resistor--;
line 10, delete "resistance" and insert --resistor--;
line 12, after "input" insert --square wave--;
line 12, after "pulse" insert --18--;
line 12, delete "shown in FIG. 2A is impressed" and insert --is applied--;

UNITED STATES PATENT OFFICE

CERTIFICATE OF CORRECTION

Patent No. 3,505,611 Dated April 7, 1970

Inventor(s) Hisashi Eguchi and Hideo Matsuoka

It is certified that error appears in the above-identified patent and that said Letters Patent are hereby corrected as shown below:

Col. 2, line 15, after "nal" insert --12--;
line 15, after "of" insert --voltage--;
line 18, delete "impressed by" and insert --receptive of--;
line 22, delete "does" and insert --is--;
line 23, delete "affect" and insert --affected--;
line 23, delete "capacity" and insert --capacitance--;
line 25, after "with" insert --a--;
line 25, delete "falling" and insert --decay--;
line 26, after "becomes" insert --an--;
line 27, after "pulse" insert --20--;
line 27, delete "such as shown in FIG. 2B is impressed"; and insert --is applied--;
line 29, delete "falling" and insert --decay--;
line 30, delete "is fallen" and insert --decays--;
line 33, delete "is" and insert --decays--;
line 33, delete "fallen";
line 33, delete "falling" and insert --decay--;
line 33, delete "character" and insert --characteristic--;
line 36, delete "as";
line 39, after "is" insert --a--;
line 42, delete "for the" and insert --to an--;
line 43, delete "the" first occurrence and insert --an--
line 45, delete "FIGS. 1 and 2" and insert --FIG. 1--;
line 46, delete "impressed by" and insert --receptive of--;
line 54, delete "by" and insert --at--;
line 55, delete "falling character" and insert --decay--;
line 60, delete "A" and insert --a--;
line 60, after "class" insert --A--;

UNITED STATES PATENT OFFICE

CERTIFICATE OF CORRECTION

Patent No. 3,505,611 Dated April 7, 1970

Inventor(s) Hisashi Eguchi and Hideo Matsuoka

It is certified that error appears in the above-identified patent and that said Letters Patent are hereby corrected as shown below:

Col. 2, line 62, after "of" insert --executing a--;
line 63, delete "on behalf" and insert --in place--;
line 68, delete "capacity" and insert --capacitance--;
line 69, delete "to";
line 70, delete "over";
line 70, delete "capacity" and insert --capacitance--;

Col. 3, line 1, delete "character" and insert --characteristic--;
line 2, after "having" insert --a--;
line 3, delete "the" first occurrence;
line 3, delete "capacity" and insert --capacitance--;
line 3, delete "the" second occurrence and insert --a--;
line 3, after "having" insert --a--;
line 4, delete "the raverse capacity" and insert --reverse capacitance--;
line 5, delete "the" and insert --a--;
line 5, after "having" insert --a--;
line 6, delete "the" first occurrence;
line 6, delete "capacity" and insert --capacitance--;
line 8, delete "the" and insert --a--.

Add the sheet of drawings as shown on the attached page.

Fig.2A

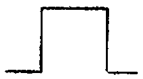

Fig.2B

Fig. 2C

Fig.3

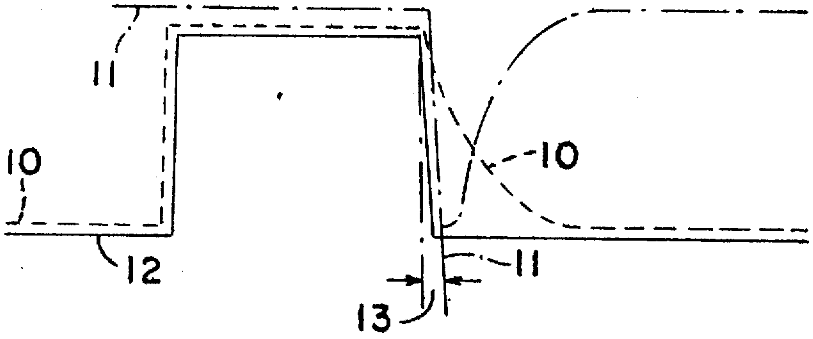

Signed and Sealed this

*twenty-fifth* Day of *November 1975*

[SEAL]

*Attest:*

RUTH C. MASON
*Attesting Officer*

C. MARSHALL DANN
*Commissioner of Patents and Trademarks*